(12) United States Patent
Mei

(10) Patent No.: US 7,168,608 B2
(45) Date of Patent: Jan. 30, 2007

(54) SYSTEM AND METHOD FOR HERMETIC SEAL FORMATION

(75) Inventor: Zequn Mei, Fremont, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 294 days.

(21) Appl. No.: 10/327,870

(22) Filed: Dec. 24, 2002

(65) Prior Publication Data

US 2004/0119247 A1    Jun. 24, 2004

(51) Int. Cl.
*B23K 31/02*    (2006.01)

(52) U.S. Cl. ......................... 228/254; 228/33

(58) Field of Classification Search .............. 228/254, 228/33, 123.1, 193, 194; 361/518, 536
See application file for complete search history.

(56) References Cited

U.S. PATENT DOCUMENTS

| | | | |
|---|---|---|---|
| 3,648,357 A | | 3/1972 | Green, Jr. |
| 4,077,558 A | | 3/1978 | Carlson et al. |
| 4,582,240 A | * | 4/1986 | Lux et al. .................. 228/121 |
| 4,834,794 A | | 5/1989 | Yagi et al. |
| 5,130,689 A | * | 7/1992 | Raykhtsaum et al. ....... 337/296 |
| 5,296,649 A | * | 3/1994 | Kosuga et al. .............. 174/250 |
| 5,320,272 A | | 6/1994 | Melton et al. |
| 5,414,303 A | * | 5/1995 | Gonya et al. ............... 257/772 |
| 6,137,690 A | * | 10/2000 | Carson et al. .............. 361/779 |
| 6,680,128 B1 | * | 1/2004 | Mei .......................... 428/570 |
| 6,793,829 B1 | * | 9/2004 | Platt et al. ..................... 216/2 |
| 2003/0160021 A1 | * | 8/2003 | Platt et al. ..................... 216/2 |

FOREIGN PATENT DOCUMENTS

| | | |
|---|---|---|
| EP | 0 461 378 A2 | 4/1991 |
| WO | WO 02/34458 | 5/2002 |

OTHER PUBLICATIONS

A.D. Romig, Jr., et al., Solder Mechanics—A State of the Art Assessment, Chapter 2—"Physical Metallurgy of Solder-Substrate Reactions", 1991, pp. 29-104.

\* cited by examiner

*Primary Examiner*—Jonathan Johnson

(57) ABSTRACT

System and method for formation of a hermetic seal with an significantly greater melting temperature than the melting temperature of the solder employed. The hermetic seal is formed from a solder with a low melting point and a metal having a predetermined thickness that corresponds to the solder. The solder and metal combination undergoes reflow for a period of time relative to the solder thickness. The resultant seal has a melting point at a temperature significantly greater than the melting temperature of the solder.

18 Claims, 4 Drawing Sheets

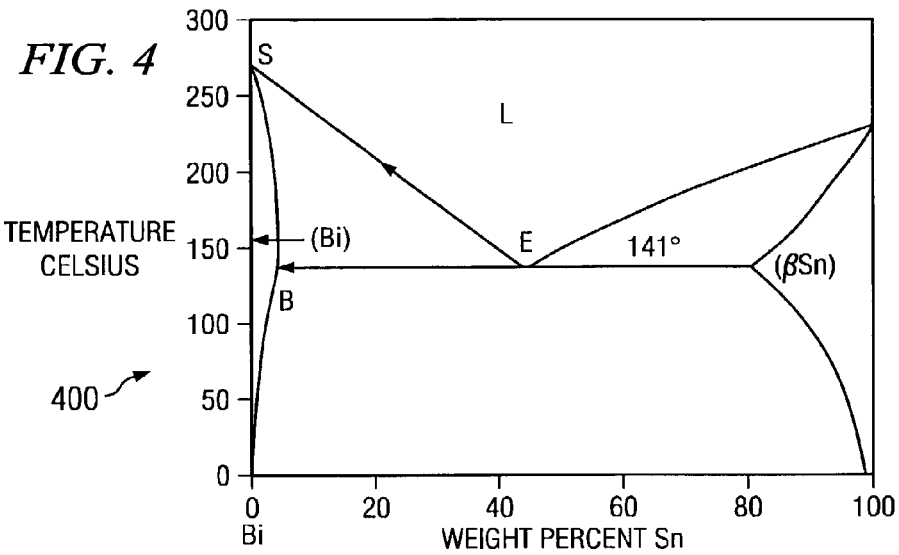
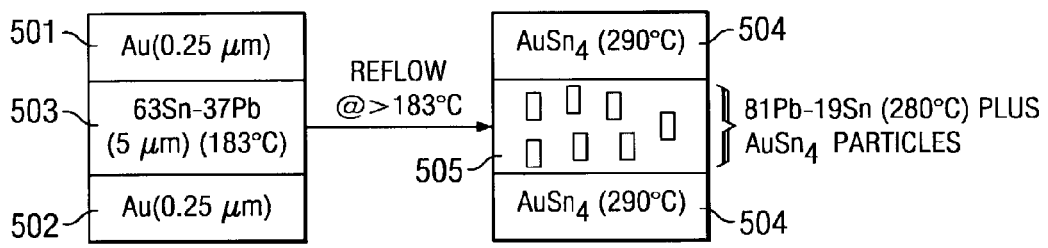
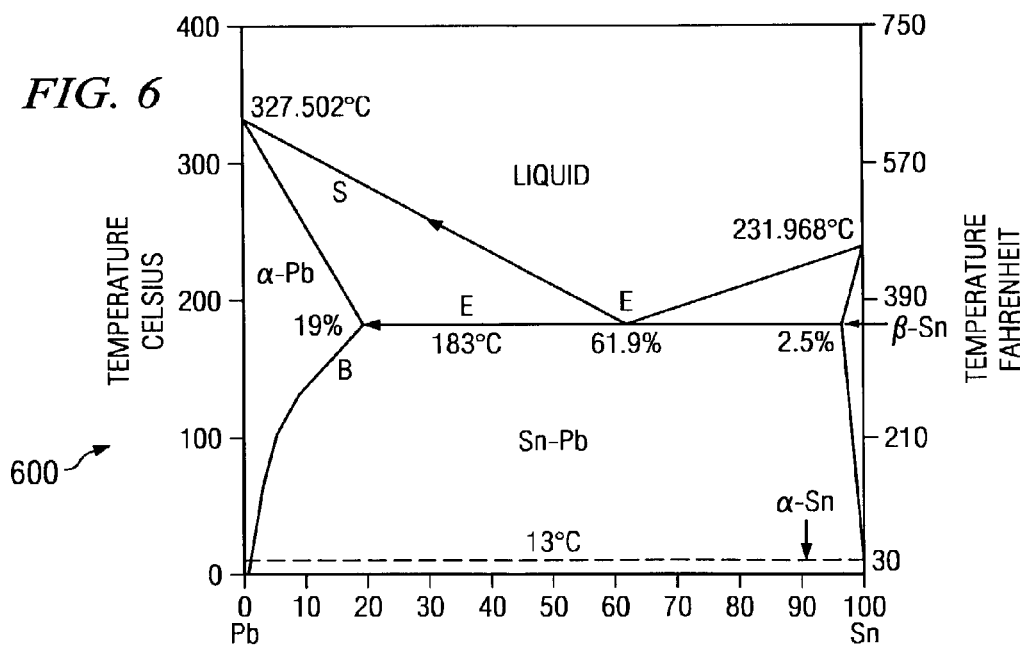

SYSTEM AND METHOD FOR HERMETIC SEAL FORMATION

TECHNICAL FIELD

The present invention relates in general to seal formation, and in particular to a system and method for hermetic seal formation.

BACKGROUND OF THE INVENTION

Hermetic seals usually are required for optoelectronic devices to make the device impervious to external influences, such as moisture. Low melting solders are desirable for sealing because the low melting temperatures will reduce the thermal induced warpage in these devices. Typical examples of low-melting solders used to form hermetic seals include indium ($T_{melt}$=156° C.), 52In-48Sn ($T_{melt}$=118° C.), 58Bi-42Sn ($T_{melt}$=138° C.), and 63Sn-37Pb ($T_{melt}$=183° C.).

The hermetic seal is produced when the base metal, Au or Cu for example, dissolves into a molten metal, such as Sn or In and their alloys, and the active constituent in the solder combines with the base metal to form an intermetallic compound. The relative amount of base metal that goes into the solution is related to its solubility in the solder, and the intermetallic compound that forms depends on the solubility of the active element in the base metal. This process depends on the length of time that the intermetallic phase temperature remains above the liquidus temperature of the solder.

It is known that Au and Cu, when compared with other noble metals such as Ag, Pt, and Pd, quickly dissolve into molten Sn, In, and their alloys, and rapidly react and form intermetallic compounds with Sn, In, and their alloys. When a molten layer of Sn or In is sandwiched between layers of Au or Cu, the whole layer of molten metal can be consumed by formation of a high melting intermetallic compound or a compound with boundary Au or Cu layers during the usual soldering process. When the molten layer of an Sn or In eutectic alloy is sandwiched between Au or Cu layers, then Au or Cu usually reacts with one element in the Sn or In alloy. This causes the Sn or In alloy to move away from its eutectic composition, and this leads to a higher melting temperature for the seal.

In the past, the Au or Cu used to make these seals has not been very thick, usually about 0.1 µm, and the melting temperature of the resulting seal has not been high enough to make subsequent step soldering, which is frequently used in manufacturing situations, easy to perform. Furthermore, there are problems with creep resistance, dimensional stability, and optical performance of the seal when placed in the optoelectronic device.

BRIEF SUMMARY OF THE INVENTION

Although the temperatures of low-melting solders previously mentioned are desirable for forming hermetic seals, there is a need to increase the melting temperatures of the hermetic seals that are formed without sacrificing the advantages that these low-melting solders provide. It is desirable to make a hermetic seal at a relatively low temperature in order to minimize thermal induced warpage. In addition, if the seal is high melting when it is made, then it can be used to engage in subsequent step soldering which is sometimes required in manufacturing operations. By having an increased melting temperature, joint creep resistance may be improved. Also, dimensional stability and optical performance may be improved.

Therefore, embodiments of the invention typically increase the melting temperature of a hermetic seal, as a function of the solder employed, to a temperature significantly higher than the solder melting temperature. The seal is typically made at a relatively low temperature, but once made, the seal usually has a significantly higher melting temperature, which may be almost twice the solder melting temperature. This is typically achieved by adapting the thickness of the Au or Cu metal used, the thickness of the solder employed, and/or by changing the reflow time required for the hermetic seal formation. Au and Cu metals react with solders much faster than other noble metals, and thus are typically employed in hermetic seal formation. The reflow time is dependent on the desired thickness of the hermetic seal, the type of solder used, as well as the thickness and type of metal used to sandwich the solder alloys. Thus, Au or Cu metal thickness and reflow time will change depending on the type of low-melting solder that is being used. For example, Sn-containing solders generally require shorter reflow time than In-containing solders.

If the reflow time employed is excessively long, then thermal damage may occur. On the other hand, if the reflow time is excessively short, then the soldering process may occur too rapidly and stability of the resulting seal will be affected. Reflow time will be approximately proportional to the square of the solder thickness. The reflow time changes to account for the thickness of Au or Cu metal. By then adjusting the solder thickness, the seal will be formed at a temperature slightly above the solder melting temperature to give the seal a significantly higher melting temperature from 50% higher to as much as twice the solder melting temperature depending on the solder employed.

As an alternative, other metals such as Ag, Pd, Pt, or Ni may be used to form this type of seal structure with molten Sn, In, or their eutectic alloys. These metals behave similarly to Au and Cu. However, using these other metals might require a longer reflow time to form the hermetic seal due to their different melting points.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 4 depicts the Bi—Sn phase diagram;

FIG. 5 depicts the transition of Au and Pb—Sn solder into AuSn$_4$ and an alloy, according to embodiments of the invention;

FIG. 6 depicts the Pb—Sn phase diagram;

DETAILED DESCRIPTION OF THE INVENTION

Figure 11A:
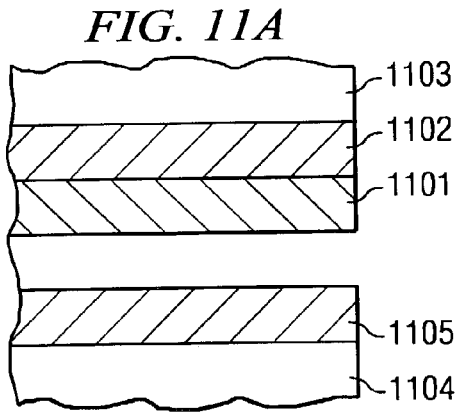
FIGS. 11A and 11B depict the surfaces to be sealed before and after reflow, according to embodiments of the invention.
Figure 11B:
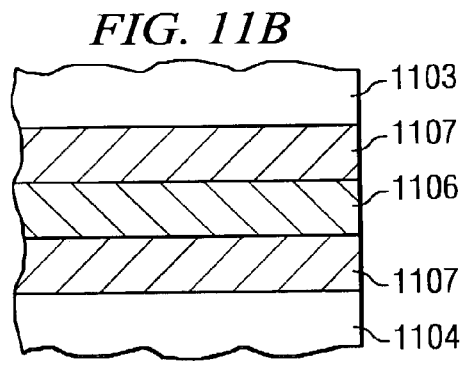

Electrolytic plating is typically used to plate the two surfaces 1101, 1104 to be sealed with either a Au or Cu metal 1102, 1105. A thermal evaporation device may be then used to deposit a low-melting solder 1101 on the metallization plating 1102 of one part of the optical assembly 1103 as shown in FIG. 11A. The two surfaces are put in contact to reflow at a temperature usually approximately 30–40° C. above the melting temperature of the eutectic solder as shown in FIG. 11B to form the molten alloy 1106. The reflow time may range from as little as 3 minutes for a 5 μm-thick solder to as much as 30 minutes if the solder is twice as thick, but typically reflow should occur for approximately 5 minutes. Reflowing also forms intermetallic compound 1107 which, along with alloy 1106, forms the hermetic seal.

A 5–10 μm sample of the low-melting solder is typically used as a standard thickness range for the solder, but the thickness of the Au or Cu metal used will change depending on the type and amount of low-melting solder that is used. Further, the reflow time will be different for each solder employed. Four different low-melting solders are proposed, and one of these solders has been tested.

Figure 2:
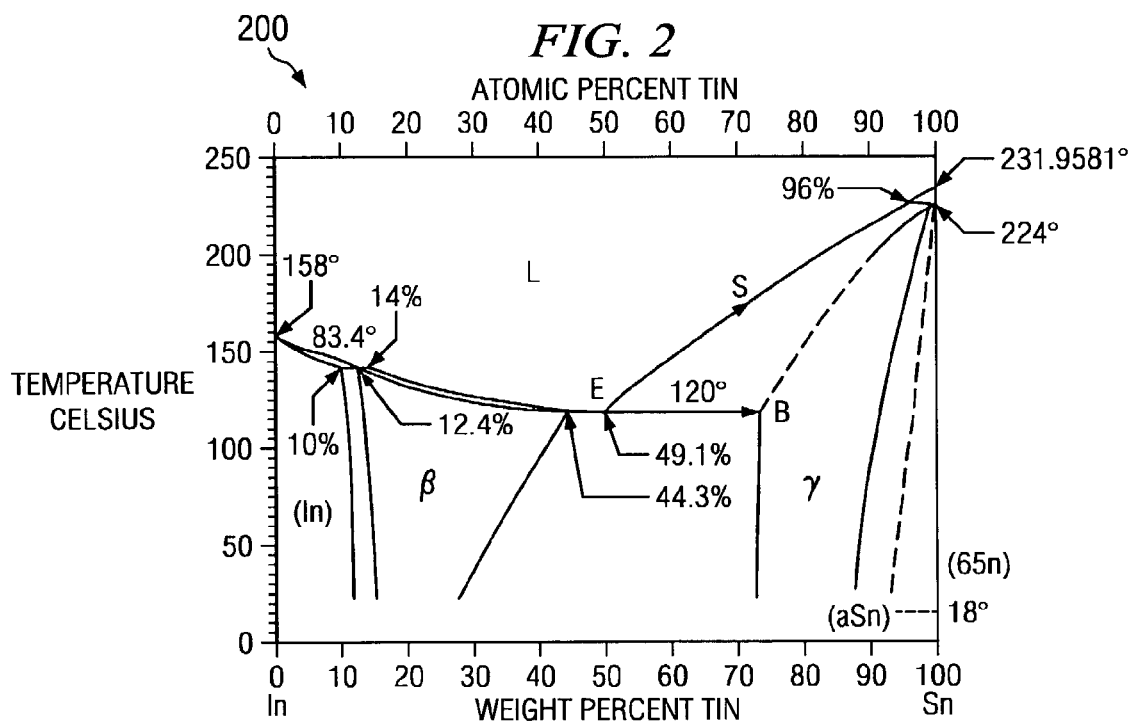
FIG. 2 depicts the In—Sn binary phase diagram.

In a first embodiment of the invention, the two surfaces to be sealed are typically coated with at least 0.32 μm of Au 101, 102. 5 μm layer of 52In-48Sn 103 (note that all solder compositions are in weight percent unless specified otherwise) is coated on at least one of the surfaces. Note that all of the solder may be on one surface, or a portion of the solder may be on each surface (e.g. 0.3 μm on one surface and 0.2 μm on the other surface). The two surfaces are typically placed in contact and reflow at a temperature typically approximately 30–40° C. above the melting temperature of eutectic 52In-48Sn (118° C.). The chemical reactions and phase changes that occur during reflow would be best described in the In—Sn—Au phase diagram at 118° C. FIG. 2 approximates the In—Sn—Au diagram with the In—Sn binary phase diagram 200.

Figure 1:
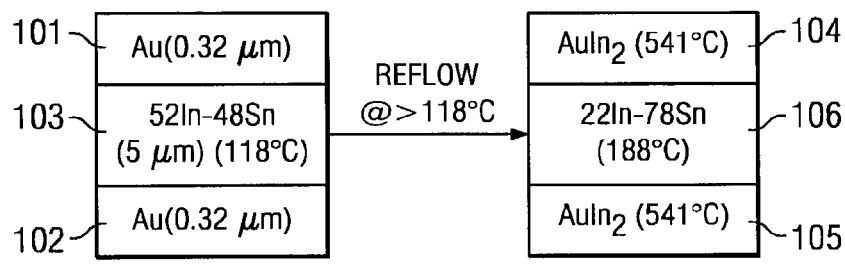
FIG. 1 depicts the transition of Au and In—Sn solder into AuIn$_2$ and an alloy, according to embodiments of the invention.
Figure 8:
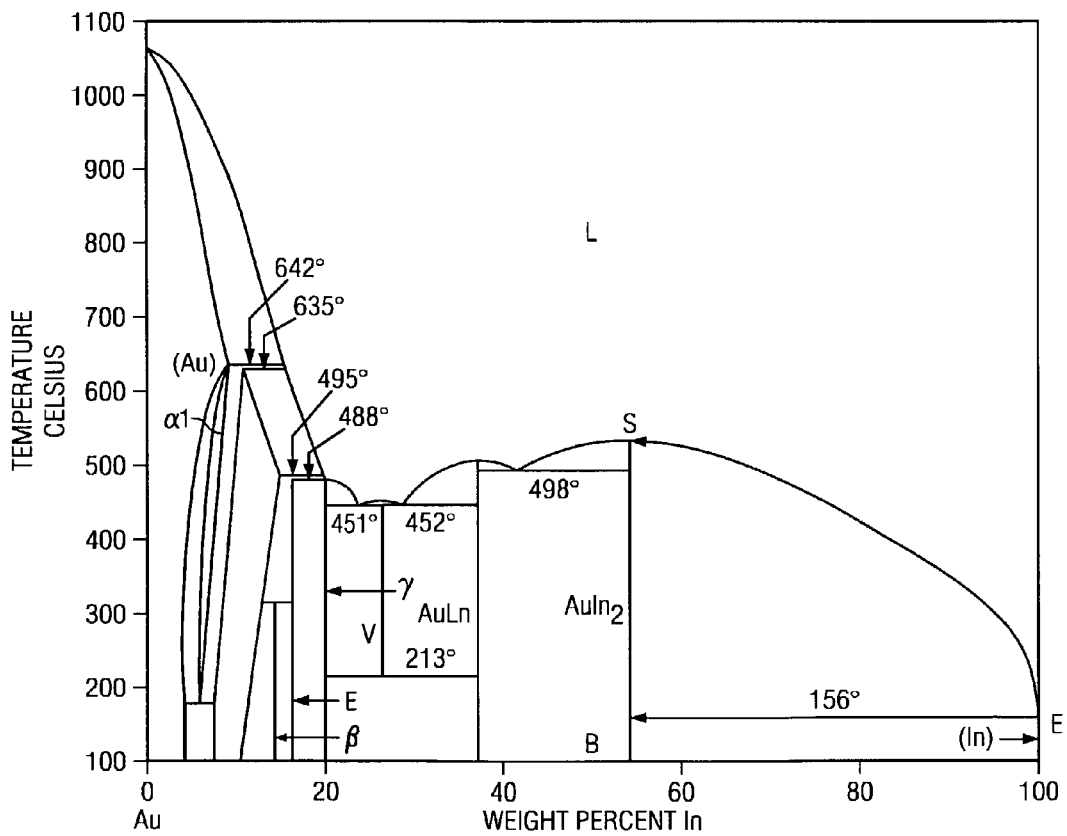
FIG. 8 depicts the Au—In phase diagram as well as Au—In crystal structure data.
Figure 10A:
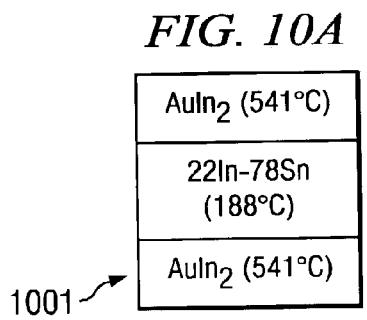
FIGS. 10A, 10B, 10C, 10D depict four examples of metallic hermetic seals that are formed, according to embodiments of the invention.

As shown in FIG. 1, AuIn$_2$ is the intermetallic compound 104, 105 formed between Au and molten In—Sn alloys 106. The Sn concentration in AuIn$_2$ is typically negligible. The melting temperature of this resulting intermetallic compound is 541° C. as obtained from the In—Au binary phase diagram 800 in FIG. 8. As the Sn concentration in molten In—Sn increases, the melting temperature also increases. As shown in FIG. 2, as Au and In form AuIn$_2$, the concentration of In—Sn typically moves along the arrow from point E to point B, causing an increase of liquidus temperature along the arrow from point E toward point S, and resulting in the precipitation of γ-phase inside the molten 52In-48Sn. When the In—Sn concentration reaches point B, most of 52In-48Sn has typically transformed to γ-phase with liquidus temperature of about 188° C. and an average concentration of about 22In-78Sn, which is about 59% higher than melting temperature of the solder 103. An example of a seal 1001 formed according to this embodiment is shown in FIG. 10A.

In a second embodiment of the invention, the two surfaces to be sealed are typically coated with at least 0.18 μm of Au. 5 μm layer of 58Bi-42Sn is coated on one of the surfaces. Note that all of the solder may be on one surface, or a portion of the solder may be on each surface (e.g. 0.3 μm on one surface and 0.2 μm on the other surface). The two surfaces are typically placed in contact and reflow at a temperature typically approximately 30–40° C. above the melting temperature of eutectic 58Bi-42Sn (138° C.).

Figure 3:
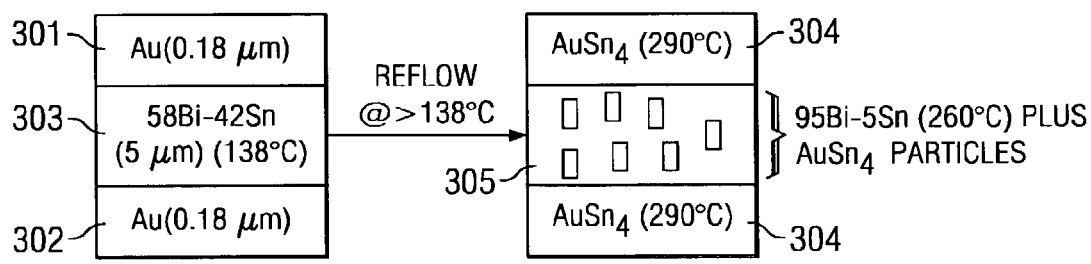
FIG. 3 depicts the transition of Au and Bi—Sn solder into AuSn$_4$ and an alloy, according to embodiments of the invention.

Similar to the 52In-48Sn solder, as shown in FIG. 3, Au layers 301, 302 react with Sn in molten eutectic 58Bi-42Sn 303, forming the intermetallic compound 304, AuSn$_4$, typically with little reaction between Bi and Au. The melting temperature of this resulting intermetallic compound is 290° C. as obtained from the Sn—Au binary phase diagram. However, unlike with the 52In-48Sn solder, the AuSn$_4$ intermetallic compound forms not only at the Au/molten Bi—Sn interface but also inside the molten Bi—Sn based on the high solubility of Au in molten Bi—Sn.

Figure 10B:
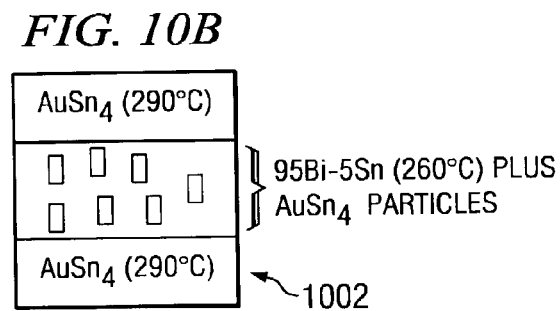

As the Bi concentration in molten Bi—Sn increases, the melting temperature also increases. FIG. 4, the Bi—Sn binary phase diagram 400, depicts that as Au and Sn form AuSn$_4$, the concentration of Bi—Sn typically moves along the arrow from point E toward point B, resulting in an increase of liquidus temperature along the arrow from point E toward point S, and also resulting in the precipitation of a Bi-rich phase inside the molten 58Bi-42Sn. When the Bi—Sn concentration reaches point B, most of 58Bi-42Sn typically has transformed to Bi-rich phase 305 with liquidus temperature of about 260° C. and an average concentration of about 95Bi-5Sn. Note that the liquidus temperature at phase 305 is about 88% higher than the melting temperature of the solder 103. An example of a seal 1002 formed according to this embodiment is shown in FIG. 10B.

In a third embodiment of the invention, the two surfaces 501, 503 to be sealed are typically coated with at least 0.25 μm of Au. Note that all of the solder may be on one surface, or a portion of the solder may be on each surface (e.g. 0.3 μm on one surface and 0.2 μm on the other surface). 5 μm layer 503 of 63Sn-37Pb is coated on one of the surfaces. Note that all of the solder may be on one surface, or a portion of the solder may be on each surface (e.g. 0.3 μm on one surface and 0.2 μm on the other surface). The two surfaces are placed in contact and reflow at a temperature typically approximately 30–40° C. above the melting temperature of eutectic 63Sn-37Pb (183° C.).

As shown in FIG. 5, similar to the Bi—Sn solder above, Au layers react with Sn in molten 63Sn-37Pb, forming the intermetallic compound AuSn$_4$ 504, typically with little reaction between Pb and Au. The melting temperature of this resulting intermetallic compound is 290° C. as obtained from the Sn—Pb binary phase diagram in FIG. 6.

Figure 10C:
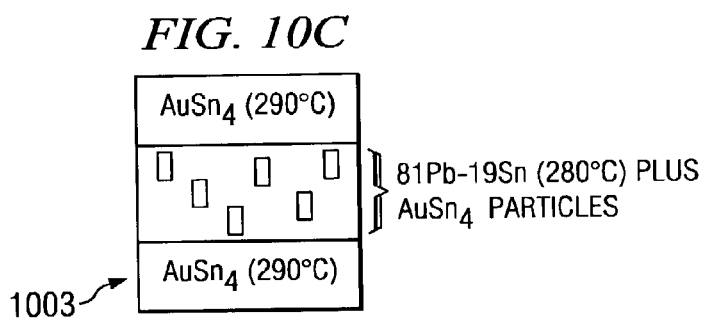

The AuSn$_4$ intermetallic phase forms not only at the Au/molten Pb—Sn interface, but also inside the molten Pb—Sn. As shown in FIG. 6, the Pb—Sn binary phase diagram 600, as Au and Sn form AuSn$_4$, the concentration of Pb—Sn typically moves along the arrow from point E toward point B, resulting in an increase of liquidus temperature along the arrow from point E toward point S, and also resulting in the precipitation of α-Pb phase inside the molten 63Sn-37Pb. When the Pb—Sn concentration reaches point B, most of 63Sn-37Pb has usually transformed to α-Pb phase 505 with liquidus temperature of about 280° C. and an average concentration of about 81Pb-19Sn. Note that the liquidus temperature of the phase 505 is about 53% higher than the melting temperature of the solder 503. An example of a seal 1003 formed according to this embodiment is shown in FIG. 10C.

Figure 7:
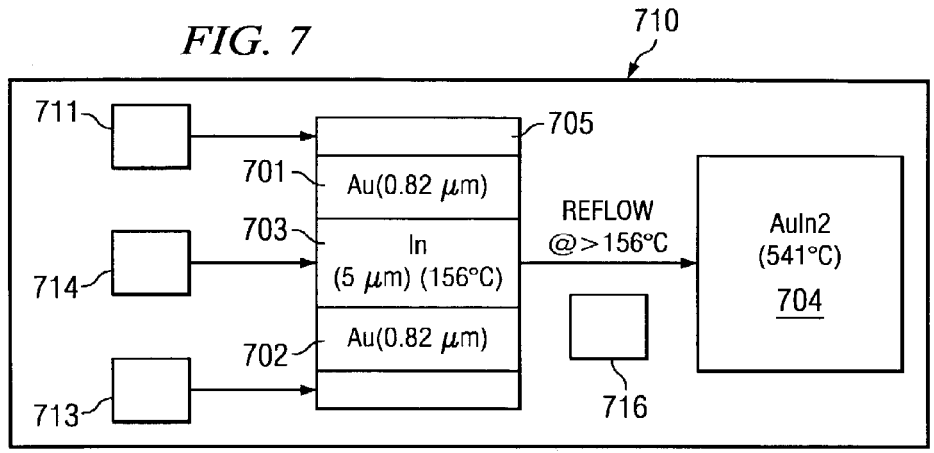
FIG. 7 depicts the transition of Au and indium solder into AuIn$_2$, according to embodiments of the invention.

In a fourth embodiment of the invention, the two surfaces 701, 702 to be sealed are coated with at least 0.82 μm of Au. 5 μm layer 703 of In is coated on one of the surfaces. Note that all of the solder may be on one surface, or a portion of the solder may be on each surface (e.g. 0.3 μm on one surface and 0.2 μm on the other surface). The two surfaces are typically placed in contact and reflow at 200° C., a temperature approximately 30–40° C. above the melting temperature of eutectic In (156° C.). Au and In react forming the intermetallic compound 704, AuIn$_2$ as indicated in FIG. 7. The melting temperature of this resulting intermetallic compound is 541° C., which is about 247% higher than the melting temperature of the solder 703.

Figure 10D:
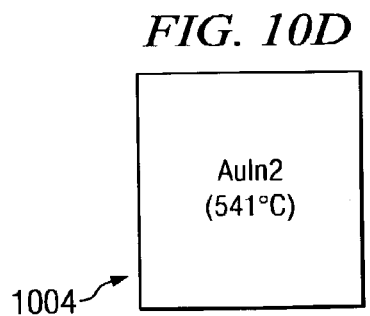

The Au and In thicknesses in FIG. 7 were calculated from their respective atomic volumes. The atomic volume of Au is 10.2 cm$^3$/mol, and the atomic volume of In is 15.7 cm$^3$/mol. To form AuIn$_2$, 1 atom of Au and 2 atoms of indium are required. In FIG. 7, the indium of the middle layer is 5 μm thick and should 0.0005/15.7=3.18e$^{-5}$ mol, assuming that the area of In is 1 cm$^2$. The mole number of Au on each boundary layer should be equal to ¼ of the mole number of In, i.e., 3.18e$^{-5}$×0.25=7.96e$^{-6}$ mol. The thickness of the Au layer is then equal to its mole number multiplied by the atomic volume, i.e., 7.96e$^{-6}$×10.2=0.000082 cm=0.82 μm. An example of a seal 1004 formed according to this embodiment is shown in FIG. 10D.

An example of a system 710 to form the seal 1004 for a two-layer optical assembly is also shown in FIG. 7. A multi-layer of metallization of Cr(500 Å)/Pt(1000 Å)/Au (200 Å) 705 may be typically deposited on both parts by electron-beam thermal evaporation equipment 711. A photolithography process may be used to carve the metallization in a circular ring pattern on both parts. Electrolytic plating 713 then may be used to plate a 1.5 μm thick Au on both metallization rings of parts. A thicker sample of Au typically is used to ensure that enough Au is present to complete the reaction because the thickness of the solder may vary and could be as much as 10 μm thick. A thermal evaporation device 714 may be used to deposit a 6 μm-thick In on the metallization ring of one part. The parts may be aligned and assembled using a custom assembly machine 715. The reflow temperature is typically 200° C. and may be provided by a heater or oven 716, and reflow time is usually approximately three minutes. Note that these components are cited by way of example only, as other components could be used to form the layers, arrange the parts, and reflow the solder.

Figure 9:
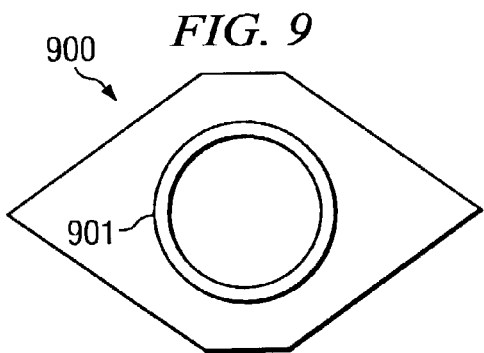
FIG. 9 depicts an ultrasonic C-scan of a continuous ring between two parts, assembled with In between thick Au layers, according to embodiments of the invention.

Five samples were made of the seal 1004, and all showed a good hermeticity measured by He-leak test (2×10$^{-10}$ Pa m$^3$/s). One of the samples was characterized using an ultrasonic C-scan, showing a good seal around the ring. FIG. 9 shows the ultrasonic C-scan 900 of a continuous ring 901 between the two parts, assembled with indium between thick Au layers.

It will be apparent to those skilled in the art that many modifications and variations may be made to the preferred embodiments of the present invention, as set forth above, without departing substantially from the principles of the present invention. All such modifications and variations are intended to be included herein within the scope of the present invention, as defined in the claims that follow.

What is claimed is:

1. A hermetic seal comprising:
   a solder having a melting point at a first temperature;
   a metal having a predetermined thickness that corresponds to the solder;
   whereby the combination of the solder and metal undergoes reflow to form said hermetic seal; and
   whereby said hermetic seal has a melting point at a second temperature, wherein the second temperature is at least 50% greater than the first temperature.
2. The hermetic seal of claim 1 where the metal is Au.
3. The hermetic seal of claim 1 where the metal is Cu.
4. The hermetic seal of claim 1 where the metal is one of Ag, Pd, Ni and Pt.
5. The hermetic seal of claim 1 where a thickness of the metal is related to a thickness of the solder.
6. The hermetic seal of claim 1 where the low-melting solder is 52In-48Sn.
7. The hermetic seal of claim 6 where the Au metal thickness is at least 0.32 μm.
8. The hermetic seal of claim 1 where the low-melting solder is 58Bi-42Sn.
9. The hermetic seal of claim 8 where the Au metal thickness is at least 0.18 μm.
10. The hermetic seal of claim 1 where the low-melting solder is 63Pb-37Sn.
11. The hermetic seal of claim 10 where the Au metal thickness is at least 0.25 μm.
12. The hermetic seal of claim 1 where the low-melting solder is pure indium.
13. The hermetic seal of claim 12 where the Au metal thickness is at least 0.82 μm.
14. The hermetic seal of claim 1 where the reflow time varies from 3–30 minutes.
15. The hermetic seal of claim 1 where the reflow time is approximately 3 minutes.
16. The hermetic seal of claim 1 where the reflow temperature is 200° C.
17. The hermetic seal of claim 1 where the combination of the solder and metal undergoes reflow at a temperature 30–40° C. above said first temperature to form an intermetallic compound and an alloy which combine to form said hermetic seal.
18. The hermetic seal of claim 17 where said alloy is 22In-78Sn.

* * * * *